United States Patent [19]

Kaneko

[11] Patent Number: 5,150,882
[45] Date of Patent: Sep. 29, 1992

[54] TREATMENT SYSTEM HAVING GATE DEVICE FOR DECOMPRESSION CHAMBER

[75] Inventor: Satoshi Kaneko, Yokohama, Japan

[73] Assignee: Tokyo Electron Limited, Tokyo, Japan

[21] Appl. No.: 731,474

[22] Filed: Jul. 17, 1991

[30] Foreign Application Priority Data

Jul. 20, 1990 [JP] Japan .................. 2-192472

[51] Int. Cl.⁵ .................................. F16K 25/00
[52] U.S. Cl. ............................ 251/193; 251/368
[58] Field of Search ............... 251/193, 203, 280, 368

[56] References Cited

U.S. PATENT DOCUMENTS

| 4,640,223 | 2/1987 | Dozier . | |
|---|---|---|---|
| 5,002,255 | 3/1991 | Sawa et al. | 251/193 |

FOREIGN PATENT DOCUMENTS

| 0152555 | 8/1985 | European Pat. Off. . | |
|---|---|---|---|
| 0179610 | 4/1986 | European Pat. Off. . | |
| 0367424 | 5/1990 | European Pat. Off. . | |
| 4019385 | 12/1990 | Fed. Rep. of Germany . | |
| 58-67842 | 4/1983 | Japan . | |
| 3608554 | 9/1987 | Japan | 251/366 |
| 136990 | 3/1961 | U.S.S.R. | 251/193 |
| 1093854 | 5/1984 | U.S.S.R. | 251/193 |

OTHER PUBLICATIONS

G. Niemann 'Maschinenelemente Band I', 1981, Springer-Verlag, Berlin Heidelberg, New York, pp. 257–278.

*Primary Examiner*—John C. Fox
*Attorney, Agent, or Firm*—Oblon, Spivak, McClelland, Maier & Neustadt

[57] ABSTRACT

A toggled gate device to be used for opening and closing a gate aperture leading to a magnetron plasma etching apparatus comprises a gate for being pressed against the wall defining the gate aperture to hermetically cover the gate aperture. The gate is supported by a support member such that the gate is movable in substantially the horizontal direction toward and away from the gate aperture. The support member is vertically driven by a cylinder. Stopper plates are arranged at an upper portion of the gate and provided with a surface inclined divergently from the edge remote from the gate aperture toward the edge close to the gate aperture. Rollers are arranged on the wall to abut the respective stopper plates. The stopper plates and the rollers are made of an iron or nickel-based double boride hard alloy. Part of the force applied to the rollers by the gate through the respective stopper plates is converted into a force moving and urging the gate toward the wall.

11 Claims, 6 Drawing Sheets

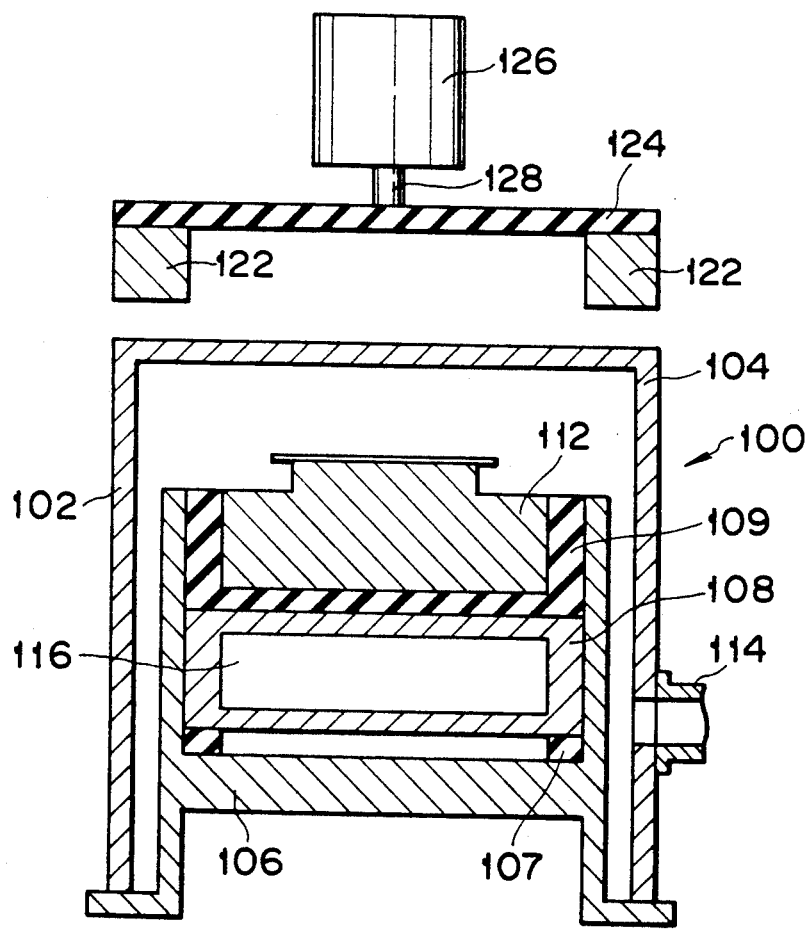
F I G. 2

TREATMENT SYSTEM HAVING GATE DEVICE FOR DECOMPRESSION CHAMBER

BACKGROUND OF THE INVENTION

1. Field of the Invention

This invention relates to a treatment system having a gate device for a decompression chamber and, more particularly, it relates to a magnetron plasma etching apparatus, having a load-lock gate, used for treating ultra LSIs.

2. Description of the Related Art

An installation for manufacturing semiconductor devices normally comprises various apparatuses for processing semiconductor wafers in vacuum, where load-lock gate devices are applied to partition connected vacuum chambers or isolate the inside of vacuum chambers from atmosphere so as to treat wafers continuously. A toggled gate device is a type of these gate devices.

A toggled gate device is so designed that it moves and aligns a gate with a gate aperture by means of rotatable gate rollers that come to abut or rather collide with the forward end of the gate. After the collision, the force that tends to drive the gate further in that direction is utilized to bring the gate in close contact with the gate aperture to make a seal as the rollers are rotated on the gate.

The rollers that take part in the collision are normally made of stainless steel, whereas the gate including its upper portions that also take part in the collision is usually made of aluminum. Since the collision takes place under considerable pressure and, thereafter, the rollers are forced to rotate on the surface of the gate under that pressure, the upper portions of the gate against which the rollers are respectively pressed are scraped to produce dust that can be dispersed into and pollute the ambient atmosphere of the processing site.

The process of manufacturing semiconductor devices, such as devices having an integration degree of more than 16M, requires accurate treatment. In a magnetron plasma etching apparatus that requires a high degree of vacuum and performs anisotropic etching for semiconductor devices of more than 16M, the process can be seriously affected by the dust given off by scraping the metal gate in terms of yield and efficiency. Such dust did not cause problems when the etching apparatus was used for treating semiconductor devices of less than 16M.

Besides, as the surface of the metal gate is scraped by the rollers, the toggled gate device tends to malfunction and adversely affect its reliability.

Additionally, a gate device applied to a load-lock type vacuum chamber connected to a magnetron plasma etching apparatus can be selectively eroded by the air in the etching apparatus at the scraped area.

While the above described problems are particularly remarkable at the portions of the gate against which the respective rollers collide, similar problems may be observed at other locations where friction takes place.

SUMMARY OF THE INVENTION

It is therefore the object of the present invention to provide a gate device for a decompression chamber that effectively prevents generation of dust and corrosion at locations where friction takes place and consequently enhance the yield of the related processing apparatus.

According to a first aspect of the invention, the above object is achieved by providing a treatment system having a gate device to be used for opening and closing a gate aperture, through which an object to be treated is loaded and unloaded, of a decompression chamber, comprising: a wall means for defining the gate aperture arranged on it; a gate for being pressed against the wall means to hermetically cover the gate aperture; a support member for supporting the gate movable toward and away from the gate aperture in a first direction; means for driving the support member in a second direction substantially perpendicular to the first direction; a stopper plate arranged at an end of the gate in the second direction and having a surface inclined divergently from the edge remote from the gate aperture toward the edge close to the gate aperture, the stopper plate being made of a material selected from sapphire, ruby and an iron or nickel-based double boride hard alloy; a roller arranged to abut the stopper plate, the axis of the roller being stationary relative to the wall means; and converting means for converting part of the force applied to the roller by the gate through the stopper plate in the second direction into a force moving and urging the gate toward the wall means in the first direction.

According to a second aspect of the invention, the above object is achieved by providing a treatment system having a gate device to be used for opening and closing a gate aperture, through which an object to be treated is loaded and unloaded, of a decompression chamber, comprising: wall means for defining the gate aperture arranged on it; a gate for being pressed against the wall means to hermetically cover the gate aperture; a support member for supporting the gate movable toward and away from the gate aperture in a first direction; means for driving the support member in a second direction substantially perpendicular to the first direction; and converting means for converting movement of the movable support member in the second direction to movement of the gate in the first direction to close or open the gate aperture; wherein whole or part of each of its components directly subjected to friction between a part stationary relative to the wall means and part movable relative to the wall means is made of a material selected from sapphire, ruby and an iron or nickel-based double boride hard alloy.

Sapphire, ruby or a double boride hard alloy to be used for components which are subjected to friction is very hard and highly abrasion-resistive so that the components may hardly be scraped and produce dust if they are hit by considerable force. Moreover, since the above cited materials provide a highly smooth surface, they are by far less liable to abrasion than the materials that have been conventionally used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a longitudinal sectional view of the magnetion etching apparatus incorporated in the system of FIG. 2;

DETAILED DESCRIPTION OF THE PREFERRED EMBODIMENTS

Figure 1:
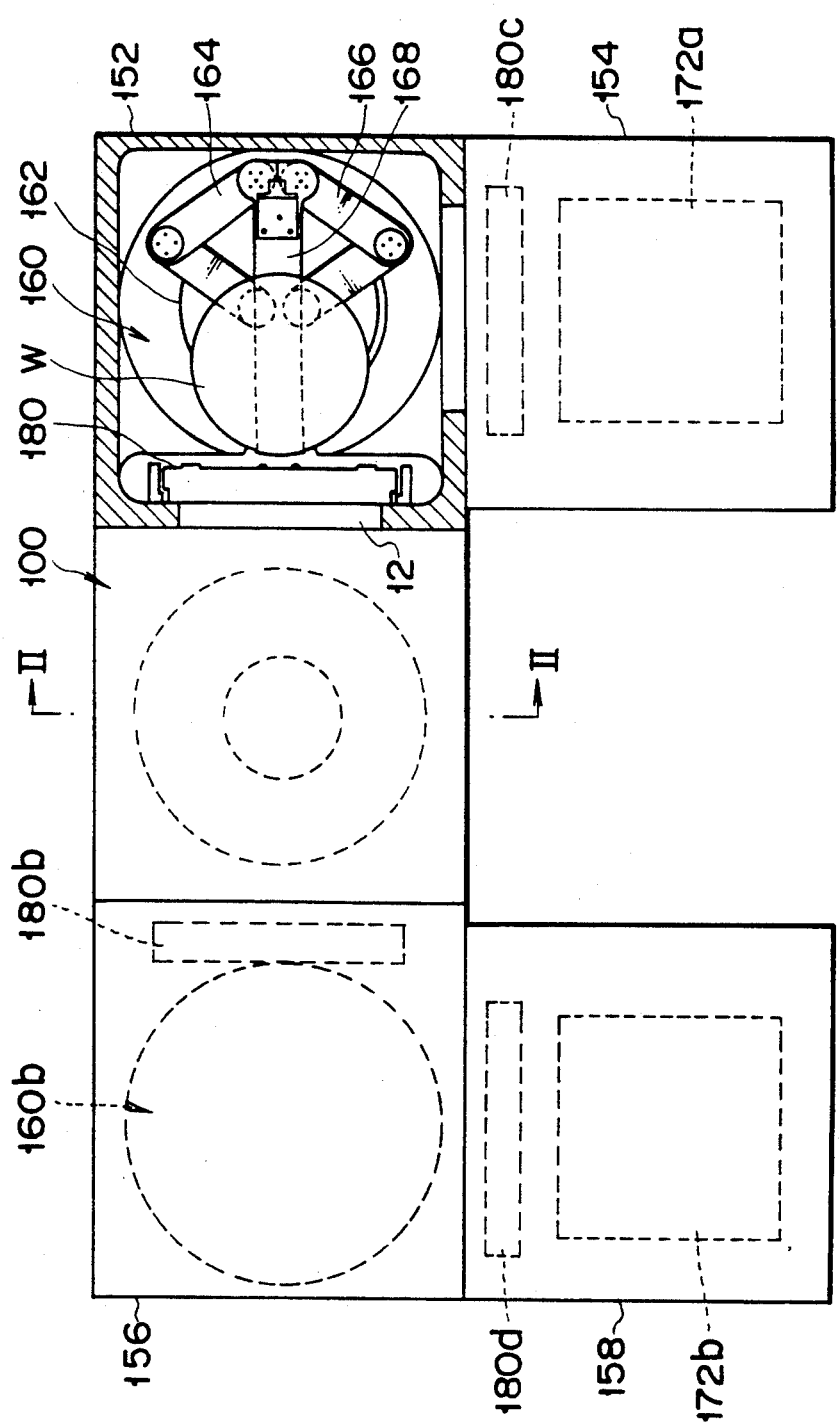
FIG. 1 is a partially cut-off plan view of a magnetron plasma etching system incorporating toggled gate devices according to the invention, showing schematically the system configuration.

Referring to FIG. 1 illustrating a preferred embodiment of the invention, magnetron plasma etching apparatus 100 (having a configuration as shown in greater detail in FIG. 2) is hermetically connected to a first load-lock type decompression chamber 152 at the wafer loading side and to a second load-lock type decompression chamber 156 at the wafer unloading side so as to perform etching treatment continuously. By turn, the chamber 152 is connected to a loading section 154 in which a wafer is pre-positioned on the basis of a portion thereof, such as a orientation flat, while the chamber 156 is connected to an unloading section 158. Both sections 154 and 158 contain unprocessed and processed wafer cassettes 172a and 172b respectively.

The load-lock type decompression chambers 152 and 156 can be independently evacuated in a known manner and contain respective wafer transfer robots 160, 160b of the same type. While the inside is illustrated in FIG. 1 and will be described beow only for the chamber 152 for the purpose of simplicity, the illustration and the description are equally applicable to the robot 160b in the chamber 156.

The robot 160 is provided with a circular rotary support 162. A pair of reciprocating linkages 164 and 166 are pivoted at respective points which are located close to each other near the outer periphery of the support 162. The movable members of the linkages 164 and 166 are connected to a fork 168 at the remote ends so that it may be driven back and forth to move a wafer W carried by it as the linkages fold and extend themselves. The fork 168 may change its direction by turning the support 162.

An embodiment of the gate device 180 according to the present invention is arranged in the chamber 152 in juxtaposition with the gate aperture 12 of the etching apparatus 100. Gate devices 180b, 180c and 180d of the same type as that of the gate device 180 are arranged respectively between the etching apparatus 100 and the chamber 156, between the chamber 152 and the section 154 and between the chamber 156 and the section 158 in a similar manner. The gate device 180 is a so called load-lock gate which is opened when a wafer is passing by, while it is hermetically closed in general to form a vacuum space.

Now, how the operation of processing wafers by a system for magnetron plasma etching as schematically illustrated in FIG. 1 proceeds will be described. Note that, in the course of this procedure, the gate devices 180 through 180d are so operated and the chambers 152 and 156 are so evacuated by a know technique that the air intake/discharge level of the etching apparatus 100 is minimized.

Firstly, the fork 168 of the robot 160 is directed toward the section 154 and a wafer W is taken up by the 168 is fork 168 from the cassette 172a. As the fork 168 is folded to draw the wafer W into the chamber 152, it is turned and directed to the etching apparatus 100. Then, the fork 168 is extended and the wafer W is sent into the etching apparatus 100, where it undergoes an etching process as described later. The processed wafer W is then taken up by the robot 160b of the chamber 156 and stored in the cassette 172b in the section 158.

Referring now to FIG. 2 illustrating in greater detail the etching apparatus 100, it is of the RIE type and comprises a housing 102 constituted by an upper frame 104 and a lower frame 106. Insulator frames 107 and 109, and a jacket 108 are arranged in the housing 102 and a susceptor 112 is placed on the insulator frame 109. As the upper frame 104 is grounded and the susceptor 112 is supplied with RF power, a pair of oppositely arranged electrodes are established there.

Facing the wafer W in the apparatus and above the upper frame 104, there is provided a disc 124 that carries under it permanent magnets 122. The disc 124 is securely fitted to the shaft 128 of an electric motor 126. As the disc is driven to revolve by the motor 126, the magnets 122 under the disc 124 rotate to generate a magnetic field found near the wafer W and parallel to its surface.

Etching gas is introduced into the housing 102 in such a manner that the inner gas pressure of the housing 102 is always maintained at a relatively low level between $10^{-2}$ and $10^{-3}$ Torr by appropriately discharging the gas within the housing 102 by way of a discharge port 114. The introduced etching gas is turned to plasma by the effect of the electric charge applied to it between the opposite electrodes. Because of the interaction between the magnetic field and the electric field produced there by the plasm sheath and directed perpendicular to the magnetic field in a magnetron plasma etching apparatus, electrons are caused to move cycloidally and eventually collide against gas molecules to increase the total number of times of ionization within the apparatus, making it possible to produce a hiqh etching speed with a relatively low pressure as cited above.

For etching operation, wafers W are normally cooled to approximately $-60°$ C. A room 116 is arranged within the jacket 108 to contain liquefied nitrogen for cooling wafers.

Figure 3:
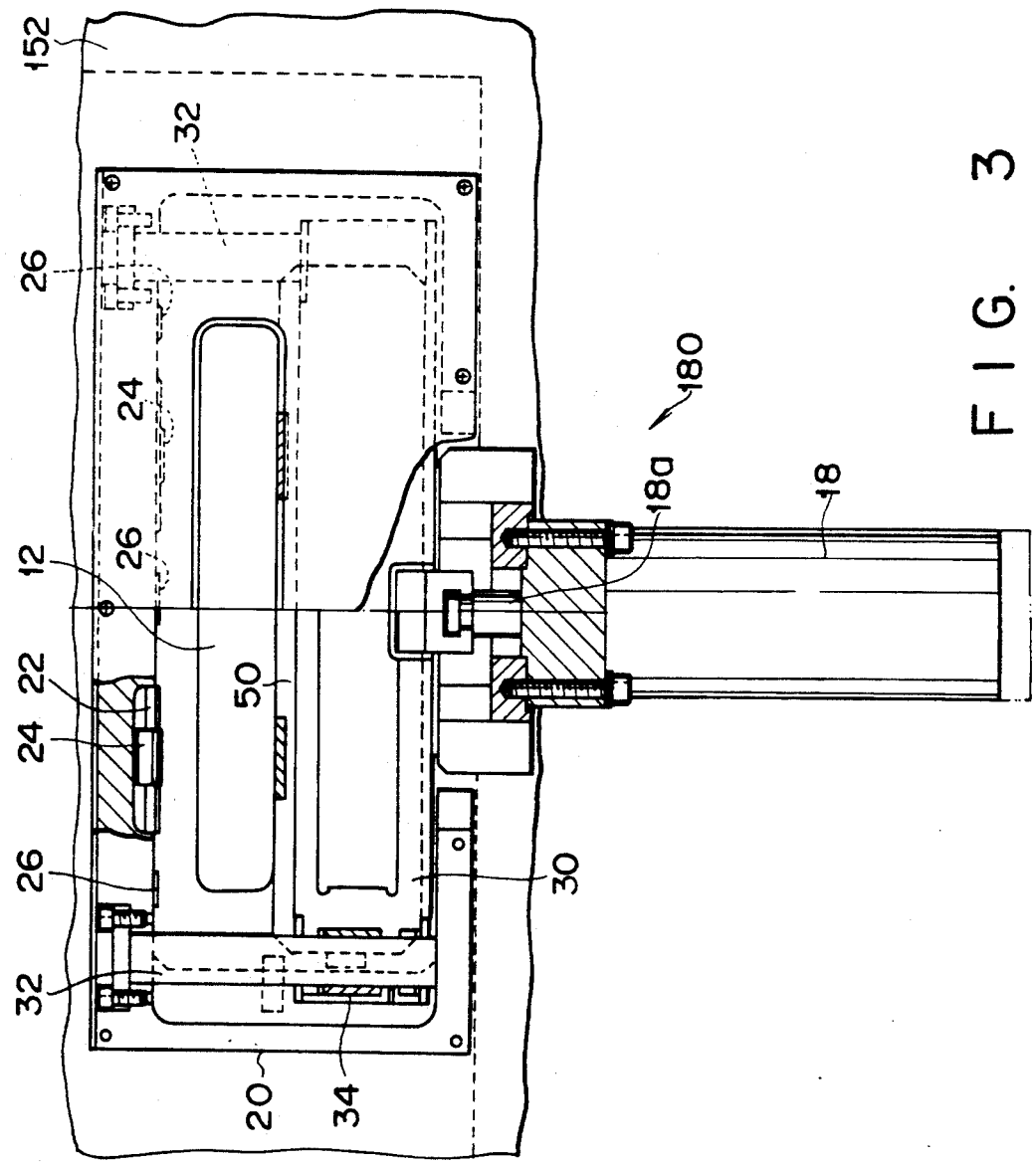
FIG. 3 is a partial cut off view of one of the toggled gate devices according to the invention and incorporated in the system of FIG. 1.
Figure 4:
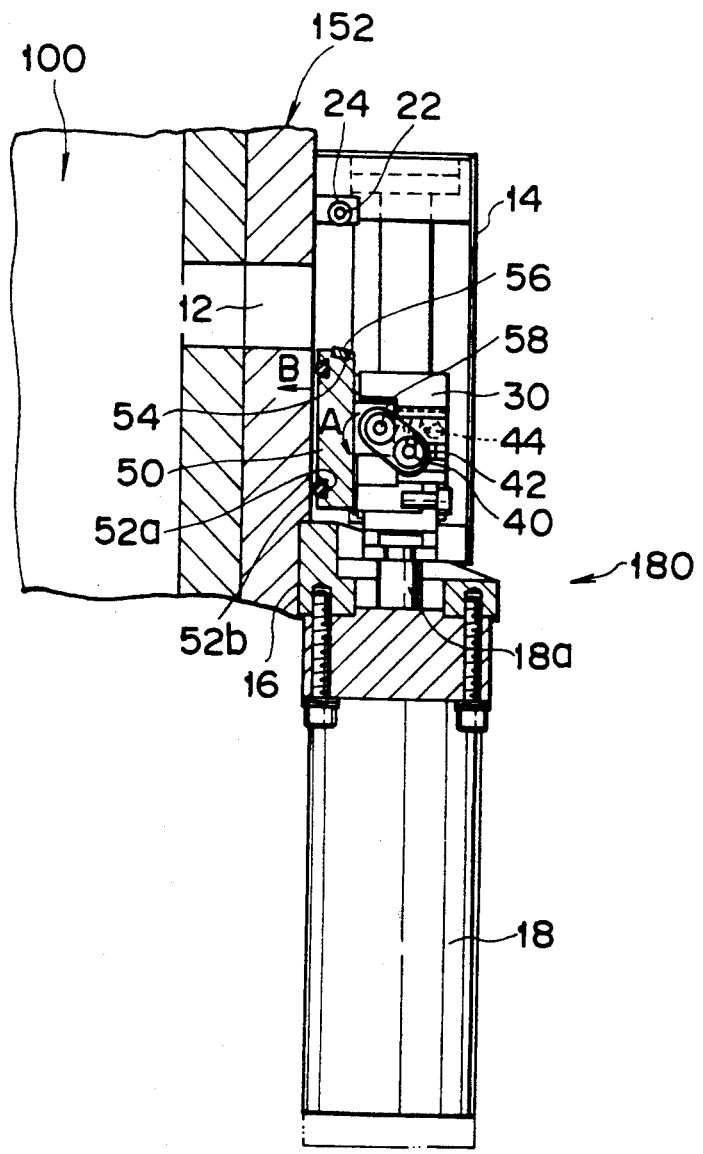
FIG. 4 is a lateral sectional view of the toggled gate device of FIG. 3.
Figure 5:
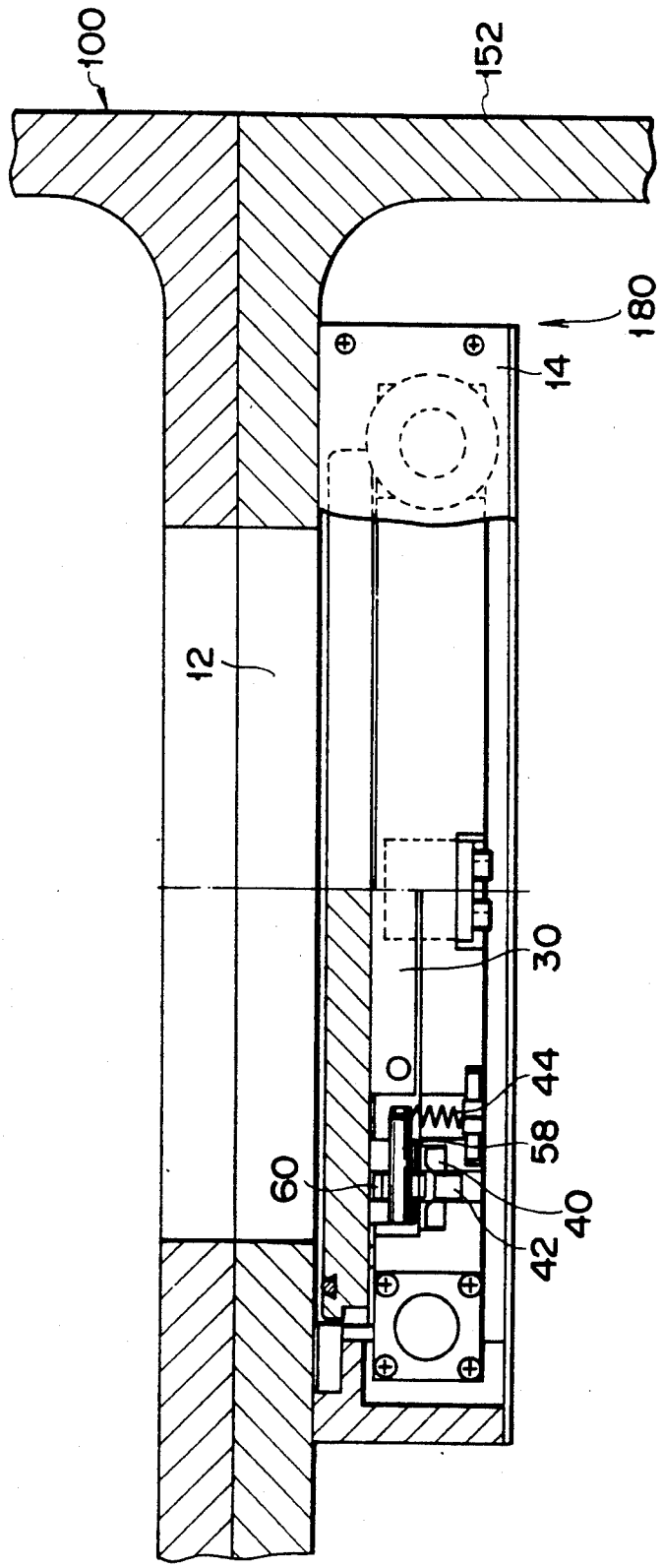
FIG. 5 is a horizontal sectional view of the toggled gate device of FIG. 3.
Figure 6:
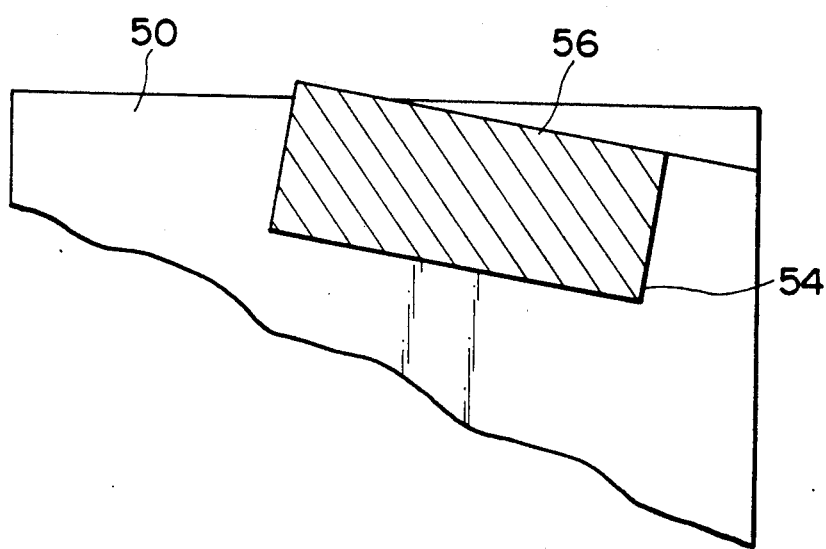
FIG. 6 is a schematic illustration showing the relationship between the upper portion of the gate and the stopper plates of the toggled gate device of FIG. 3.

Referring to FIGS. 3 through 5, the decompression chamber 152 is provided with a gate aperture 12, which is covered by a cover 14 of the gate device 180 as illustrated in FIGS. 4 and 5. A bracket 16 is rigidly fitted to the lower end of the chamber 152 and a air cylinder 18 to be used for opening and closing the gate 50 is securely fitted to the bracket 16.

The cover 14 contains within it a gate fitting plate 30 connected to cylinder shaft 18a and supported by guide rails 32, 32 by way of bearings 34, 34 so that it may be vertically movable along the rails 32, 32. The gate 50 is supported by the gate fitting plate 30 by means of a link mechanism, which will be described later.

The bearings 34, 34 are made of a double boride hard alloy prepared by using iron as a principal ingredient.

KH Hard Alloy (trade name; available from Toyo Kohan Co., Ltd. and disclosed in Japanese Patent No. 1329953 etc.), an iron-based and sintered double boride hard alloy containing Cr, Mo, Ni and W, may be among the materials that are advantageously used for the bearings 34, 34. Alternatively, a nickel-based alloy containing the above mentioned elements may also be used.

A stopper frame 20 is rigidly fitted to the inside of the cover 14 and a pair of rollers 24, 24 are rotatably supported by respective shafts at two locations on the surface of the stopper frame 20 facing the upper surface of the gate 50. These rollers 24, 24 are used to align the gate 50 with the gate aperture 12.

The rollers 24, 24 are made of a double boride hard alloy prepared by using iron as a principal ingredient. KH Hard Alloy (trade name; available from Toyo Kohan Co., Ltd.) as mentioned earlier may also be among the materials that are advantageously used for the rollers.

Three dampers are arranged on the stopper frame 20, one between the rollers 24, 24 and the remaining two at respective positions off the rollers, in order to dampen the shock imparted to the frame when the fitting plate 30 collides against it.

Now, the link mechanism for fitting the gate to the fitting plate 30 will be described. A first link shaft 40 is rigidly fitted to the fitting plate 30 to rotatably support an end of a link 42 by way of a bearing (not shown). On the other hand, a second link shaft 58 is rigidly fitted to the rear side of the gate 50 to rotatably support the other end of the link 42 by any of a link bearing 60. A tension coil spring 44 is provided to bias the gate 50 away from the side of the decompression chamber 152 where the gate aperture 12 is arranged. An end of the spring 44 is anchored to a spring stopper arranged on the fitting plate 30, while its other end is securely held to the second link shaft 58 fitted to the gate 50.

The gate 50 is large enough to entirely cover the gate aperture 12 and provided on its front surface with an O-ring receiving groove 52a running exactly to match the periphery of the gate aperture 12 and a sealing O-ring 52b is press fit into the groove 52a. A pair of stopper plates 56, 56 designed as stoppers for the gate 50 are arranged on the upper surface of the gate 50 at locations that correspond to the respective positions of the rollers 24, 24 supported on the stopper frame 20 as shown in FIG. 4.

The stopper plates 56, 56 are rigidly fitted into respective grooves 54, 54 arranged on the upper surface of the gate 50. Each of the bottoms of the grooves 54, 54 is so inclined that the upper surface of the related stopper plate 56 shows a slope rising from the rear side toward the front side of the gate 50. The gradient of the slopes formed by the upper surfaces of the stopper plates 56, 56 is determined as a function of the locus of movement of the inclined upper surfaces of the plates 56, 56 when the gate is moved to completely abut the periphery of the gate aperture 12 and the data concerning the wear of the corresponding area of the upper surface of a gate collected for conventional installations where stopper plates are not used. In other words, the gradient may be approximated to that of the profile of the corresponding area of the upper surface of a gate which is originally made flat but worn and deformed after use in a comparable apparatus.

The stopper plates 56, 56 are made of a double boride hard alloy prepared by using iron as principal ingredient. KH Hard Alloy (trade name; available from Toyo Kohan Co., Ltd.) as mentioned earlier may also be among the materials that ar advantageously used for the stopper plates.

The gate device as described above operates in the following manner.

When the gate aperture 12 of the decompression chamber 152 is open and free for passage, the gate 50 is found below the gate aperture 12 as shown in FIG. 4. To close the gate aperture 12 of the chamber 152, the air cylinder 18 is driven to push up the fitting plate 30 by way of the cylinder shaft 18a.

As the fitting plate 30 is g ided by the two rails 32, 32, it moves only vertically when it is driven by the air cylinder 18. Since no external force is directly applied to the gate 50 at this stage, the link 42 is urged to move clockwise in FIG. 4 by the biasing force of the tension coil spring 44 and, therefore, the gate 50 is lifted upward without touching the corresponding surface of the decompression chamber 152.

A the gate 50 is driven upward by the air cylinder 18, the stopper plates 56, 56 arranged at two different location of the gate 50 come to abut the respective rollers 24, 24 which are rotatably supported by the stopper frame 20. Since the air cylinder continues its driving operation after the abutment, the stopper plates 56, 56 consequently hit the respective rollers 24, 24 with considerable impact.

Since the stopper plates 56, 56 are made of a double boride hard alloy, which is highly anti-abrasive and capable of lubricating its surface, the surface of the stopper plates 56, 56 would not be scraped to produce dust that can be scattered into ambient atmosphere to pollute the latter, nor would it be selectively corroded in the atmosphere in the etching apparatus 100.

Thus, the stopper plates 56, 56 are driven by the air cylinder 18 to go upward after they collide against the rollers 24, 24 and the gate fitting plate 30 is also lifted upward with the cylinder shaft 18a. Meanwhile, as the stopper plates 56, 56 abut the respective rollers 24, 24, the upward movement of the gate 50 is abated by the resistance of the rollers 24, 24. In other words, the stopper plates 56, 56 of the gate 50 are subjected to a force exerted by the rollers 24, 24 trying to push them down. As a result, the link 42 is rotated counterclockwise, or in the direction indicated by arrow A in FIG. 4, around the first link shaft 40.

As the link 42 is rotated in the direction of arrow A, the gate 50 is driven to move toward the gate aperture 12 of the decompression chamber 152 under the condition where the rollers 24, 24 are rotatably pressed against the respective stopper plates 56, 56. The rotation of the rollers 24, 24 facilitates the movement of the gate 50 toward the gate aperture. Note here that this movement is further helped by the fact that the upper surfaces of the stop plates 56, 56 are inclined.

Considering that the rollers 24, 24 are pressed against the respective stopper plates 56, 56 by a considerable force applied to them by the air cylinder 18, it may be clearly understood that the conventional arrangement of bringing a gate and rollers into direct contact as in the case of existing comparable etching apparatus/decompression chamber assemblies can easily result in a scraped gate surface and faulty operation of the assemblies. Since the gate of a decompression chamber according to the invention is provided with stopper plates 56, 56 which are made of a double boride hard alloy, the rollers 26, 26 can smoothly rotate on the respective stopper plates 56, 56 and the gate 50 can be smoothly moved relative to the gate aperture 12 without causing damages on the stopper plates due to scraping motion.

The operation of air cylinder 18 to drive the fitting plate 30 upward is stopped when the plate 30 abuts the damper 26 arranged on the stopper frame 20 and the sealing O-ring 52b comes to closely contact with the outer surface of the decompression chamber 152 where the gate aperture 12 is arranged so that the gate aperture 12 is hermetically sealed along its outer periphery.

When the gate 50 is opened, on the other hand, the air cylinder 18 is driven to lower the cylinder shaft 18a. As the cylinder shaft 18a comes down, the fitting plate 30 is lowered with it to release the contact between the rollers and the respective stopper plates 56, 56 so that the tension coil spring 44 urges the link 42 to rotate clockwise as indicated in FIG. 4 and separate the gate 50 from the surface of the chamber 152 where the gate aperture 12 is arranged. As the air cylinder 18 is driven further, the gate 50 is eventually returned to its original stand-by position.

The use of a double boride hard alloy is not limited to the bearings 34, 34, rollers 24, 24 and stopper plates 56, 56. Such a material is advantageously used also for other components of the gate device which are subjected to abrasion and collision. Besides, an abrasion-resistive hard and smooth material other than a double boride hard alloy, sapphire or ruby for instance, may be advantageously used for those components.

The present invention can be applied to other treating apparatuses using a decompression condition, such as a CVD apparatus, a sputtering apparatus and an ion-implanting apparatus, other than a magnetron plasma etching apparatus described as an embodiment.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A treatment system having a gate device for a decompression chamber to be used for opening and closing a gate aperture through which an object to be treated is loaded and unloaded, comprising:
   wall means for defining the gate aperture arranged on it;
   a gate for being pressed against said wall means to hermetically cover the gate aperture;
   a support member for supporting said gate, said support member being movable toward and away from said gate aperture in a first direction;
   means for driving said support member in a second direction substantially perpendicular to said first direction;
   a stopper plate arranged at an end of said gate in said second direction and having a surface inclined divergently from an edge remote from the gate aperture toward an edge close to the gate aperture, said stopper plate being made of a material selected from sapphire, ruby and an iron or nickel-based double boride hard alloy;
   a roller arranged to abut said stopper plate, the axis of said roller being stationary relative to said wall means; and
   converting means for converting part of a force applied to said roller by said gate through said stopper plate in said second direction into a force moving and urging said gate toward said wall means in said first direction.

2. A treatment system according to claim 1, wherein said stopper plate is made of an iron or nickel-based double boride hard alloy.

3. A treatment system according to claim 1, wherein said roller is made of a material selected from sapphire, ruby and an iron or nickel-based double boride hard alloy.

4. A treatment system according to claim 3, wherein said roller is made of an iron or nickel-based double boride hard alloy.

5. A treatment system according to claim 3, wherein said device further comprises a rail held stationary relative to said wall means and defining a track of said support member in said second direction, and a bearing arranged to engage with said rail and secured to said support member, said bearing being made of a material selected from sapphire, ruby and an iron or nickel-based double boride hard alloy.

6. A treatment system according to claim 5, wherein said device is used to close or open a gate aperture leading to a magnetron plasma etching apparatus.

7. A treatment system according to claim 5, wherein said gate device is a toggled gate device.

8. A treatment system having a gate device for a decompression chamber to be used for opening and closing a gate aperture through which an object to be treated is loaded and unloaded, comprising:
   wall means for defining the gate aperture arranged on it;
   a gate for being pressed against said wall means to hermetically cover the gate aperture;
   a support member for supporting said gate, said support member being movable toward and away from said gate aperture in a first direction;
   means for driving said support member in a second direction substantially perpendicular to said first direction; and
   converting means for converting part of a force applied to said support member in said second direction into a force which moves and urges said gate toward said wall means in said first direction;
   wherein:
   a whole or part of each of the device+s components directly subjected to friction between a part stationary relative to the wall means and a part movable relative to the wall means is made of a material selected from sapphire, ruby and an iron or nickel-based double boride hard alloy; and
   said components subject to friction comprise a stopper plate arranged at an end of said gate in said second direction and a roller arranged to abut said stopper plate, the axis of said roller being stationary relative to said wall means.

9. A treatment system according to claim 8, wherein the material for said stopper plate and said roller is an iron or nickel-based double boride hard alloy.

10. A treatment system having a gate device for a decompression chamber to be used for opening and closing a gate aperture through which an object to be treated is loaded and unloaded, comprising:
   wall means for defining the gate aperture arranged on it;
   a gate for being pressed against said wall means to hermetically cover the gate aperture;

a support member for supporting said gate, said support member being movable toward and away from said gate aperture in a first direction;

means for deiving said support member in a second direction substantially perpendicular to said first direction; and converting means for converting part of a force applied to said support member in said second direction into a force which moves and urges said gate toward said wall means in said first direction; wherein:

a whole or part of each of the device's components directly subjected to friction between a part stationary relative to the wall means and a part movable relative to the wall means is made of a material selected from sapphire, ruby and an iron or nickel-based double boride hard alloy; and said components subject to friction comprise a rail held stationary relative to said wall means and defining a track of said support member in said second direction, and a bearing arranged to engage with said rail and secured to said support member.

11. A treatment system according to claim 10, wherein the material for said rail and said bearing is an iron or nickel-based double boride hard alloy.

* * * * *